US009105728B2

(12) United States Patent
Hong et al.

(10) Patent No.: US 9,105,728 B2
(45) Date of Patent: Aug. 11, 2015

(54) MULTI-GATE THIN-FILM TRANSISTOR

(75) Inventors: John Hyunchul Hong, San Clemente, CA (US); Cheonhong Kim, San Diego, CA (US); Tze-Ching Fung, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 90 days.

(21) Appl. No.: 13/557,039

(22) Filed: Jul. 24, 2012

(65) Prior Publication Data
US 2014/0027758 A1      Jan. 30, 2014

(51) Int. Cl.
*H01L 29/76* (2006.01)
*H01L 29/786* (2006.01)

(52) U.S. Cl.
CPC .... *H01L 29/78645* (2013.01); *H01L 29/78648* (2013.01)

(58) Field of Classification Search
CPC .................................................. H01L 29/78645
USPC .................................. 438/157; 257/E29.264
See application file for complete search history.

(56) References Cited

U.S. PATENT DOCUMENTS

| | | | |
|---|---|---|---|
| 5,834,797 A | 11/1998 | Yamanaka | |
| 5,929,464 A | 7/1999 | Yamazaki et al. | |
| 6,146,927 A * | 11/2000 | Yamanaka | 438/149 |
| 7,342,271 B2 | 3/2008 | Park et al. | |
| 7,800,675 B2 | 9/2010 | Shah | |
| 8,102,443 B2 | 1/2012 | Tsunai | |

| | | | |
|---|---|---|---|
| 2002/0009833 A1 | 1/2002 | Lin et al. | |
| 2002/0054522 A1 | 5/2002 | Inoue et al. | |
| 2003/0194839 A1 * | 10/2003 | Chung | 438/151 |
| 2004/0075092 A1 | 4/2004 | Arao | |

(Continued)

FOREIGN PATENT DOCUMENTS

WO  2007140081 A2  12/2007
WO  WO2007139255 A1  12/2007

OTHER PUBLICATIONS

International Search Report and Written Opinion—PCT/US2013/050273—ISA/EPO—Sep. 13, 2013.

(Continued)

*Primary Examiner* — Michael Lebentritt
*Assistant Examiner* — Aaron Dehne
(74) *Attorney, Agent, or Firm* — Weaver Austin Villeneuve & Sampson LLP

(57) ABSTRACT

This disclosure provides implementations of multi-gate transistors, structures, devices, apparatus, systems, and related processes. In one aspect, a device includes a thin-film semiconducting layer arranged over a substrate. A drain and source are coupled to the semiconducting layer. The device also includes first, second and third gates all arranged adjacent the semiconducting layer and configured to receive first, second, and third control signals, respectively. Dielectric layers insulate the gates from the semiconducting layer and from one another. In a first mode, the first, second, and third gates are configured such that charge is stored in a potential well in a region of the semiconducting layer adjacent the second gate. In a second mode, the first, second and third gate electrodes are configured such that the stored charge is transferred through the region of the semiconducting layer adjacent the third gate electrode and through the source to a load.

22 Claims, 10 Drawing Sheets

(56) References Cited

U.S. PATENT DOCUMENTS

| | | |
|---|---|---|
| 2009/0072313 A1 | 3/2009 | Cai et al. |
| 2011/0084262 A1 | 4/2011 | Kondratyuk et al. |
| 2011/0211394 A1 | 9/2011 | Scheiper et al. |

OTHER PUBLICATIONS

Weimer, Paul K., "The TFT-A New Thin-Film Transistor", Proceedings of the IRE, vol. 50. No. 6, Jun. 1, 1962, pp. 1462-1469, XP001290238.

Taiwan Search Report—TW102125604—TIPO—Jan. 30, 2015.

* cited by examiner

MULTI-GATE THIN-FILM TRANSISTOR

TECHNICAL FIELD

This disclosure relates generally to charge storage and transfer elements, and more specifically to multi-gate thin-film transistor structures suitable for use in storing charge and transferring charge to electrical or electromechanical components such as display elements.

DESCRIPTION OF THE RELATED TECHNOLOGY

Electromechanical systems (EMS) include devices having electrical and mechanical elements, transducers such as actuators and sensors, optical components (including mirrors) and electronics. EMS can be manufactured at a variety of scales including, but not limited to, microscales and nanoscales. For example, microelectromechanical systems (MEMS) devices can include structures having sizes ranging from about one micron to hundreds of microns or more. Nanoelectromechanical systems (NEMS) devices can include structures having sizes smaller than one micron including, for example, sizes smaller than several hundred nanometers. Electromechanical elements may be created using deposition, etching, lithography or other micromachining processes that etch away parts of substrates or deposited material layers, or that add layers to form electrical, mechanical and electromechanical devices.

One type of EMS device is called an interferometric modulator (IMOD). As used herein, the term IMOD or interferometric light modulator refers to a device that selectively absorbs or reflects light using the principles of optical interference. In some implementations, an IMOD may include a pair of conductive plates, one or both of which may be transparent or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the IMOD. IMOD devices have a wide range of applications, and are anticipated to be used in improving existing products and creating new products, especially those with display capabilities.

In IMOD display panels and other voltage/charge driven pixel displays, such as liquid crystal displays (LCDs), it is often desirable to update the display elements for an entire frame synchronously. In a conventional synchronous frame update scheme, the pixel or display element data for each frame is written or scanned into charge storage elements (such as passive capacitors) at each corresponding pixel, one row of pixels at a time. Subsequently, the stored charge is then synchronously transferred in one step from the storage elements to the corresponding pixels. This method of operation generally requires many capacitors and transistors. This makes implementation difficult when both a compact form factor and reliability are design concerns.

SUMMARY

The structures, devices, apparatus, systems and processes of the disclosure each have several innovative aspects, no single one of which is solely responsible for the desirable attributes disclosed herein.

Disclosed are example implementations of multi-gate thin-film transistors, devices, apparatus, systems and related fabrication processes. According to one innovative aspect of the subject matter described in this disclosure, a device includes a thin-film semiconducting layer arranged over a substrate. A drain is coupled to the semiconducting layer and is configured to receive an input signal. A source is coupled to another end of the semiconducting layer and is configured to drive an output signal. The device also includes three gate electrodes. A first gate electrode is arranged adjacent to the semiconducting layer, between the drain and the source, and is configured to receive a first control signal. A second gate electrode is arranged adjacent to the semiconducting layer, between the drain and the source, and is configured to receive a second control signal. A third gate electrode is arranged adjacent the semiconducting layer, between the drain and the source, and is configured to receive a third control signal. The second gate electrode is arranged between the first and third gate electrodes such that there is some overlap of the first and second gate electrodes and some overlap of the second and third gate electrodes but no overlap of the first and third gate electrodes. One or more dielectric layers insulate the first gate electrode from the semiconducting layer, insulate the second gate electrode from the semiconducting layer, insulate the third gate electrode from the semiconducting layer, and insulate the first, second, and third gate electrodes from one another. In some implementations, in a first mode of operation, the first, second and third gate electrodes are configured such that charge is transferred in from the drain and accumulated in a potential well in a region of the semiconducting layer adjacent to the second gate electrode. In some implementations, in a second mode of operation, the first, second and third gate electrodes are configured such that charge previously accumulated in the region of the semiconducting layer adjacent to the second gate electrode is transferred through the region of the semiconducting layer adjacent the third gate electrode and subsequently transferred through the source and output as an output signal.

In some implementations, while in the first mode of operation, the third gate electrode is off; the first gate electrode receives the first control signal and is turned on in response to the first control signal; the second gate electrode receives the second control signal and is turned on in response to the second control signal; and the drain receives the input signal and transmits charge into the semiconducting layer in response to the input signal. In some implementations, the first gate electrode is then turned off after charge is accumulated along the semiconducting layer. As a result, charge accumulated along the semiconducting layer accumulates in the potential well in the region of the semiconducting layer adjacent the second gate electrode after the first gate electrode is turned off.

In some implementations, while in the second mode of operation, the third gate electrode receives the third control signal and is turned on in response to the third control signal; the second gate electrode is turned off; and after the third gate electrode is turned on and the second gate electrode is turned off, the charge previously accumulated in the region of the semiconducting layer adjacent the second gate electrode is transferred to the source which then, in response, yields the output signal based on the transferred charge.

In some implementations, while in the first mode of operation, the second gate electrode is configured to a high capacitance state in response to the second control signal to facilitate the transfer and accumulation of charge in the region of the semiconducting layer adjacent the second gate electrode. In some implementations, while in the second mode of operation, the second gate electrode is configured to a low capacitance state to facilitate the transfer of charge from the region of the semiconducting layer adjacent the second gate electrode through the semiconducting layer and into the source.

In some implementations, the first gate electrode is arranged adjacent a first side of the semiconducting layer, the second gate electrode is arranged adjacent a second side of the semiconducting layer opposite the first side, and the third gate electrode is arranged adjacent the first side. In some such implementations, the second side of the semiconducting layer is adjacent the substrate such that the second gate electrode is arranged between the thin-film semiconducting layer and the substrate. In some other implementations, all three gate electrodes are arranged adjacent a single side of the semiconducting layer.

In some implementations, when any of one or more of the first, second and third gate electrodes is on, the portion of the semiconducting layer adjacent the respective gate electrode behaves as a conducting channel in accumulation mode. In some implementations, when any of one or more of the first, second and third gate electrodes is off, the portion of the semiconducting layer adjacent the respective gate electrode presents an energy barrier and is effectively non-conducting.

According to another innovative aspect of the subject matter described in this disclosure, a device includes a thin-film semiconducting means arranged over a substrate. A drain means is coupled to the semiconducting means and is configured to receive an input signal. A source means is coupled to another end of the semiconducting means and is configured to drive an output signal. The device also includes three gating means. A first gating means is arranged adjacent to the semiconducting means, between the drain means and the source means, and is configured to receive a first control signal. A second gating means is arranged adjacent to the semiconducting means, between the drain means and the source means, and is configured to receive a second control signal. A third gating means is arranged adjacent the semiconducting means, between the drain means and the source means, and is configured to receive a third control signal. The second gating means is arranged between the first and third gating means such that there is some overlap of the first and second gating means and some overlap of the second and third gating means but no overlap of the first and third gating means. One or more insulating means insulate the first gating means from the semiconducting means, insulate the second gating means from the semiconducting means, insulate the third gating means from the semiconducting means, and insulate the first, second and third gating means from one another. In some implementations, in a first mode of operation, the first, second and third gating means are configured such that charge is transferred in from the drain means and accumulated in a potential well in a region of the semiconducting means adjacent to the second gating means. In some implementations, in a second mode of operation, the first, second and third gating means are configured such that charge previously accumulated in the region of the semiconducting means adjacent to the second gating means is transferred through the region of the semiconducting means adjacent the third gating means and subsequently transferred through the source means as an output signal.

In some implementations, while in the first mode of operation, the third gating means is closed; the first gating means receives the first control signal and is opened in response to the first control signal; the second gating means receives the second control signal and is opened in response to the second control signal; and the drain means receives the input signal and transmits charge into the semiconducting means in response to the input signal. In some implementations, the first gating means is then closed after charge is accumulated along the semiconducting means. As a result, charge accumulated along the semiconducting means accumulates in the potential well in the region of the semiconducting means adjacent the second gating means after the first gating means is closed.

In some implementations, while in the second mode of operation, the third gating means receives the third control signal and is opened in response to the third control signal; the second gating means is closed; and after the third gating means is opened and the second gating means is closed, the charge previously accumulated in the region of the semiconducting means adjacent the second gating means is transferred to the source means which then, in response, yields the output signal based on the transferred charge.

In some implementations, while in the first mode of operation, the second gating means is configured to a high capacitance state in response to the second control signal to facilitate the transfer and accumulation of charge in the region of the semiconducting means adjacent the second gating means. In some implementations, while in the second mode of operation, the second gating means is configured to a low capacitance state to facilitate the transfer of charge from the region of the semiconducting means adjacent the second gating means through the semiconducting means and into the source means.

In some implementations, the first gating means is arranged adjacent a first side of the semiconducting means, the second gating means is arranged adjacent a second side of the semiconducting means opposite the first side, and the third gating means is arranged adjacent the first side. In some such implementations, the second side of the semiconducting means is adjacent the substrate such that the second gating means is arranged between the thin-film semiconducting means and the substrate. In some other implementations, all three gating means are arranged adjacent a single side of the semiconducting means.

In some implementations, when any of one or more of the first, second and third gating means is opened, the portion of the semiconducting means adjacent the respective gating means behaves as a conducting means in accumulation mode. In some implementations, when any of one or more of the first, second and third gating means is closed, the portion of the semiconducting means adjacent the respective gating means presents an energy barrier and is effectively non-conducting.

Details of one or more implementations of the subject matter described in this specification are set forth in the accompanying drawings and the description below. Although the examples provided in this disclosure may be described in terms of EMS and MEMS-based displays, the concepts provided herein may apply to other types of displays, such as liquid crystal displays (LCDs), organic light-emitting diode (OLED) displays and field emission displays. Other features, aspects and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

The disclosed implementations include examples of multi-gate thin-film transistors or transistor devices/structures (hereinafter all referred to as "transistors"), including a three-gate thin-film transistor (TFT). In some implementations, the three-gate TFT can be used to store charge and to transfer charge to a display element, such as an LCD pixel, an IMOD pixel, another MEMS-based device or another electrical or electromechanical element. Related apparatus, systems and fabrication processes and techniques are also disclosed.

Particular implementations of the subject matter described in this disclosure can be implemented to realize one or more of the following potential advantages. In some implementations, a TFT includes a storage gate electrode that effectively functions as an "active MOS capacitor." In a first mode of operation the biasing conditions are such that the storage gate electrode is configured to a high-capacitance state to facilitate the transfer and accumulation of charge in a storage region of a semiconducting layer of the TFT adjacent the storage gate electrode. Conversely, in a second mode of operation the biasing conditions are such that the storage gate electrode is configured to a low-capacitance state to facilitate the transfer of charge from the storage region to a display element. While in the high capacitance state, a relatively low column voltage signal $V_{Column}$ can inject a large amount of current into the storage region adjacent the storage gate electrode. While in the low capacitance state, when the storage region is electrically-coupled to the display element, the TFT achieves a highly efficient charge transfer to the display element. The ability of the TFT to switch from a high-capacitance state to write and store charge, to a low-capacitance state to transfer charge to the display element, can result in significant savings in power, among other advantages. The capacitance switching feature also allows for accurate charge injection to the display element even though the capacitance state of the display element can vary.

By way of background, a TFT is a particular type of field-effect transistor (FET) in which a semiconducting layer as well as one or more dielectric insulating layers and metallic contacts are deposited over a substrate. TFTs are commonly used in displays such as LCD displays. A TFT FET differs from a conventional FET, such as a traditional metal-oxide semiconductor (MOS) FET (MOSFET). In contrast to a TFT FET, the semiconducting layer in a MOSFET is itself part of a semiconducting substrate—typically a silicon (Si) wafer—into or over which the other electrical components including the drain and source regions, the dielectric layers, the gate, and the metallic contacts are deposited or otherwise formed.

Figure 1:
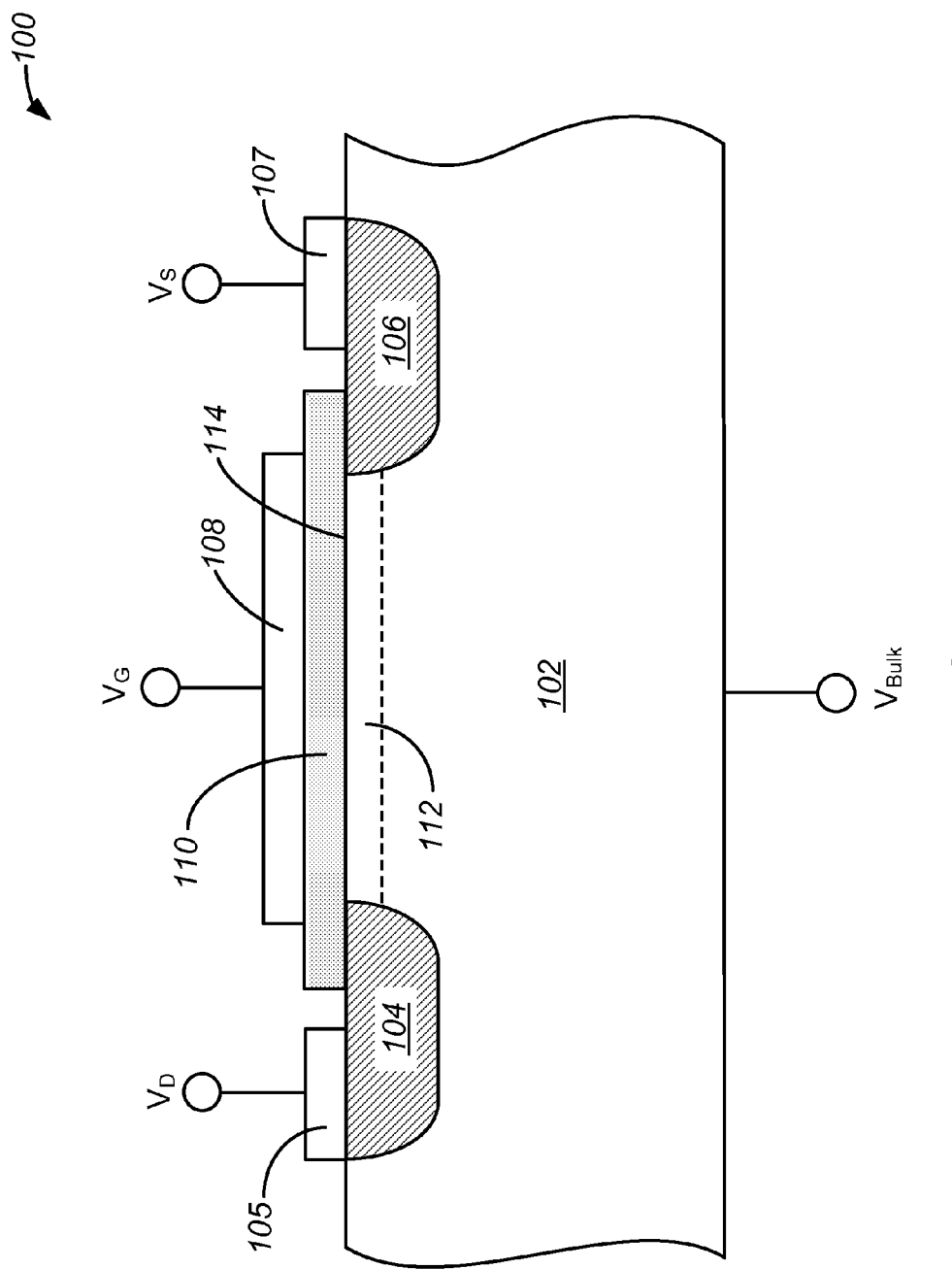
FIG. 1 shows a cross-sectional side view depiction of an example MOSFET.

FIG. 1 shows a cross-sectional side view depiction of an example MOSFET 100. The MOSFET 100 is depicted for comparison or reference purposes and includes a semiconducting substrate 102, a drain 104, a drain contact 105, a source 106, a source contact 107, a gate electrode 108 and a dielectric insulating layer 110. The "metal" in MOS refers to the gate electrode 108 (which may or may not actually be metallic—for example, polycrystalline Si is commonly used), the "oxide" refers to the dielectric layer 110 (which may or may not actually be an oxide—other dielectrics are frequently used having larger dielectric constants), and the "semiconductor" refers to the semiconducting substrate 102. Generally, the semiconducting substrate can either be p-type (as shown) or n-type. In the traditional MOSFET convention, the current flow is such that electrons enter the device through the source 106, are subject to the gating action of the gate electrode 108 while traveling through a channel region 112 in the semiconductor substrate 102, and leave through the drain 104. Consistent with this naming scheme, "holes" would travel the opposite direction—as with conventional current terminology, in which current is defined to flow in the same direction as positive charge carriers.

Depending on the biasing applied to the semiconducting substrate 102, the drain 104, the source 106 and the gate electrode 108, the MOSFET 100—more particularly the semiconducting material in the channel region 112 below the gate electrode 108 and between the source 106 and the drain 104—can be considered to be in one of three physically distinct biasing states: accumulation, depletion or inversion. For example, when a p-type MOSFET 100 is biased in accumulation, majority positive charge carriers—"holes"—accumulate near the semiconductor-dielectric interface 114. When a p-type MOSFET 100 is biased in depletion, the channel region 112 becomes depleted of the majority holes. Finally, when a p-type MOSFET 100 is biased in inversion, the minority negative charge carriers—the electrons—accumulate near the semiconductor-dielectric interface 114 forming a conductive channel (an "n-channel") in the channel region 112. Similarly, when an n-type MOSFET is biased in accumulation, majority electrons accumulate near the semiconductor-dielectric interface 114; when biased in depletion, the channel region 112 becomes depleted of the majority electrons; and when biased in inversion, minority holes form a conductive channel (a "p-channel") in the channel region 112.

Also by way of background, a display, such as an IMOD display or an LCD display, generally includes an array of display elements also referred to as pixels. Some such displays can include arrays of hundreds, thousands or millions of pixels arranged in hundreds or thousands of rows and hundreds or thousands of columns. For example, some such displays include 1024×768 arrays, 1366×768 or 1920×1080 arrays, where the first number indicates the width of the display in number of columns and the second number indicates the height of the display in number of rows. Each pixel, in turn, can include one or more sub-pixels. For example, each pixel can include a red sub-pixel, a green sub-pixel and a blue sub-pixel that emit red, green and blue light, respectively. The three colors can be selectively combined to produce and display various colors of varying intensities. For example, each red sub-pixel, green sub-pixel and blue-sub-pixel, in turn, can further include an array of one or more sub-sub-pixels for discretely adjusting an intensity of each of the constituent colors—red, green and blue emitted by the pixel.

Figure 2:
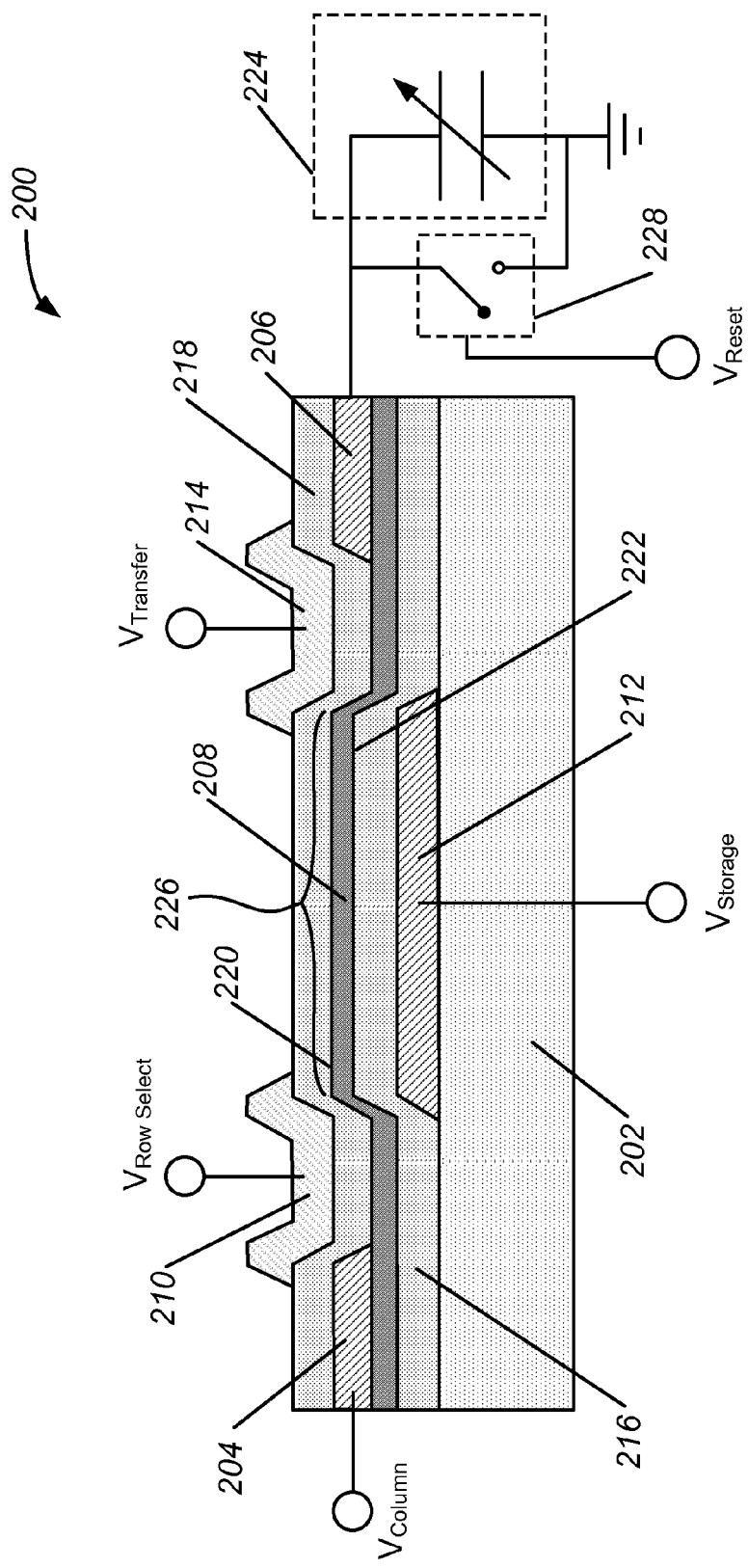
FIG. 2 shows a cross-sectional side view depiction of an example three-gate thin-film transistor.

Each pixel, sub-pixel or sub-sub-pixel can be driven by a multi-gate TFT as described in this disclosure. The combination of a TFT and the corresponding pixel or pixel element may hereinafter be referred to collectively as a display element. FIG. 2 shows a cross-sectional side view depiction of an example three-gate TFT 200. TFT 200 includes a substrate 202, a drain 204, a source 206, a thin-film semiconducting layer 208, a first "write" gate electrode 210, a second "storage" gate electrode 212, a third "transfer" gate electrode 214, a first (or lower) dielectric layer 216 and a second (or upper) dielectric layer 218. In the disclosed implementations, no limitation is meant to be inherent or suggested by way of calling the "drain" 204 a "drain" as opposed to a "source," or the "source" 206 a "source" as opposed to a "drain." That is, the two terms—drain and source—are used interchangeably in this disclosure. For example, electrons may enter the three-gate TFT 200 by way of the drain 204 and leave the three-gate TFT 200 by way of the source 206, or vice versa, depending on the type of semiconducting material used in the semiconducting layer 208 and on the biases applied to the gate electrodes 210, 212 and 214.

Figure 5:
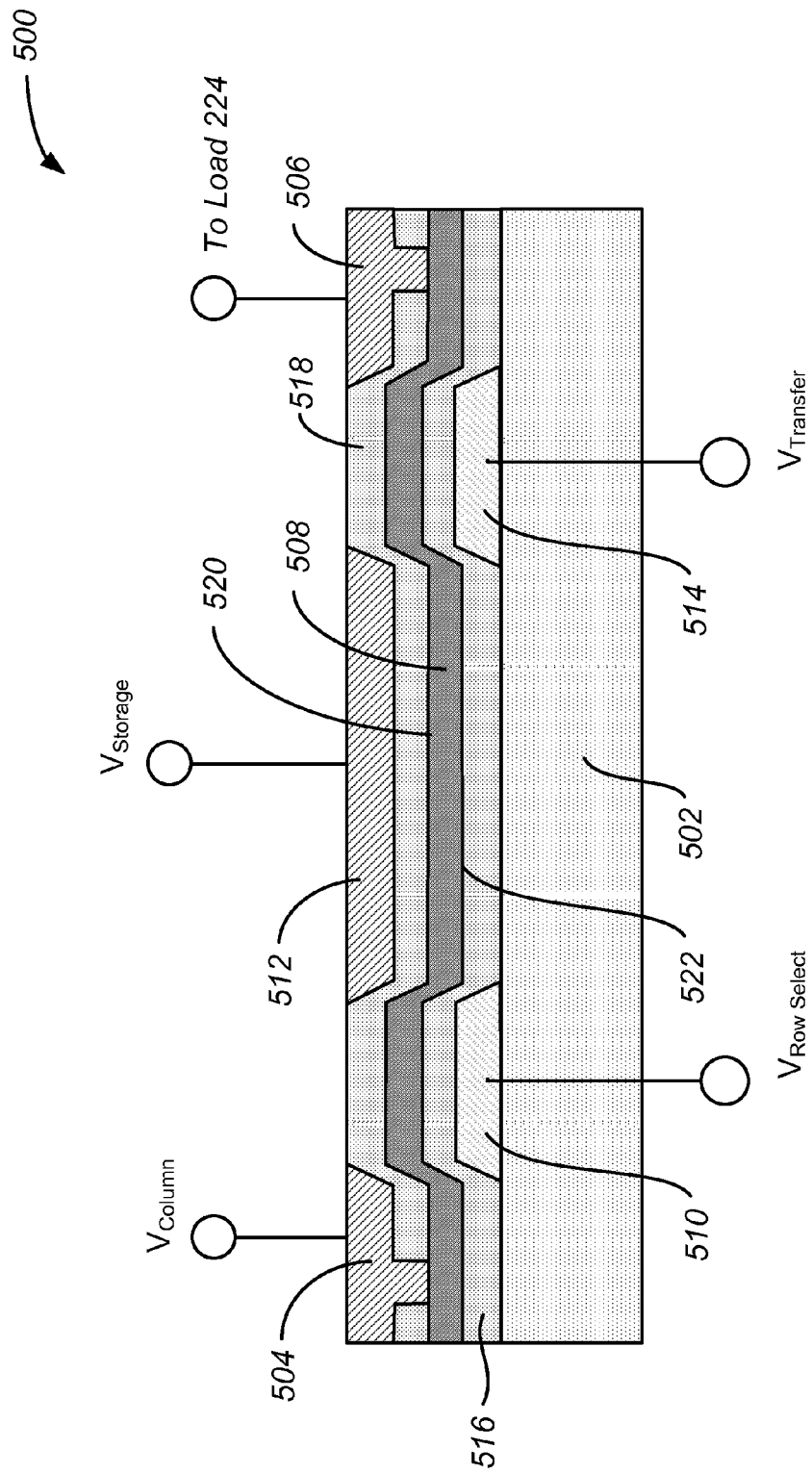
FIG. 5 shows a cross-sectional side view depiction of an example three-gate thin-film transistor.

In the implementation depicted in FIG. 2, the write gate electrode 210 and the transfer gate electrode 214 are arranged adjacent one side of the thin-film semiconducting layer 208, while the storage gate electrode 212 is arranged adjacent an opposite side of the thin-film semiconducting layer 208. More specifically, FIG. 2 depicts an implementation in which the write gate electrode 210 and the transfer gate electrode 214 are arranged over the upper surface 220 of the thin-film semiconducting layer 208 while the storage gate electrode 212 is arranged below the lower surface 222 of the semiconducting layer 208. In some other implementations, the arrangement can be reversed; that is, the storage gate electrode 212 can be arranged over the upper surface 220 while the write gate electrode 210 and the transfer gate electrode 214 can be arranged below the lower surface 222. For example, FIG. 5 shows a cross-sectional side view depiction of such an example three-gate TFT 500. TFT 500 includes a substrate 502, a drain 504, a source 506, a thin-film semiconducting layer 508, a first "write" gate electrode 510, a second "storage" gate electrode 512, a third "transfer" gate electrode 514, a first (or lower) dielectric layer 516 and a second (or upper) dielectric layer 518. Like the TFT 200 depicted in FIG. 2, the TFT 500 depicted in FIG. 5 is arranged such that the write gate electrode 510 and the transfer gate electrode 514 are arranged adjacent one side of the thin-film semiconducting layer 508, while the storage gate electrode 512 is arranged adjacent an opposite side of the thin-film semiconducting layer 508. However, contrary to the TFT 200 depicted in FIG. 2, the TFT 500 depicted in FIG. 5 is arranged such that the write gate electrode 510 and the transfer gate electrode 514 are arranged under the lower surface 522 of the thin-film semiconducting layer 508 while the storage gate electrode 512 is arranged over the upper surface 520 of the semiconducting layer 508.

Figure 6:
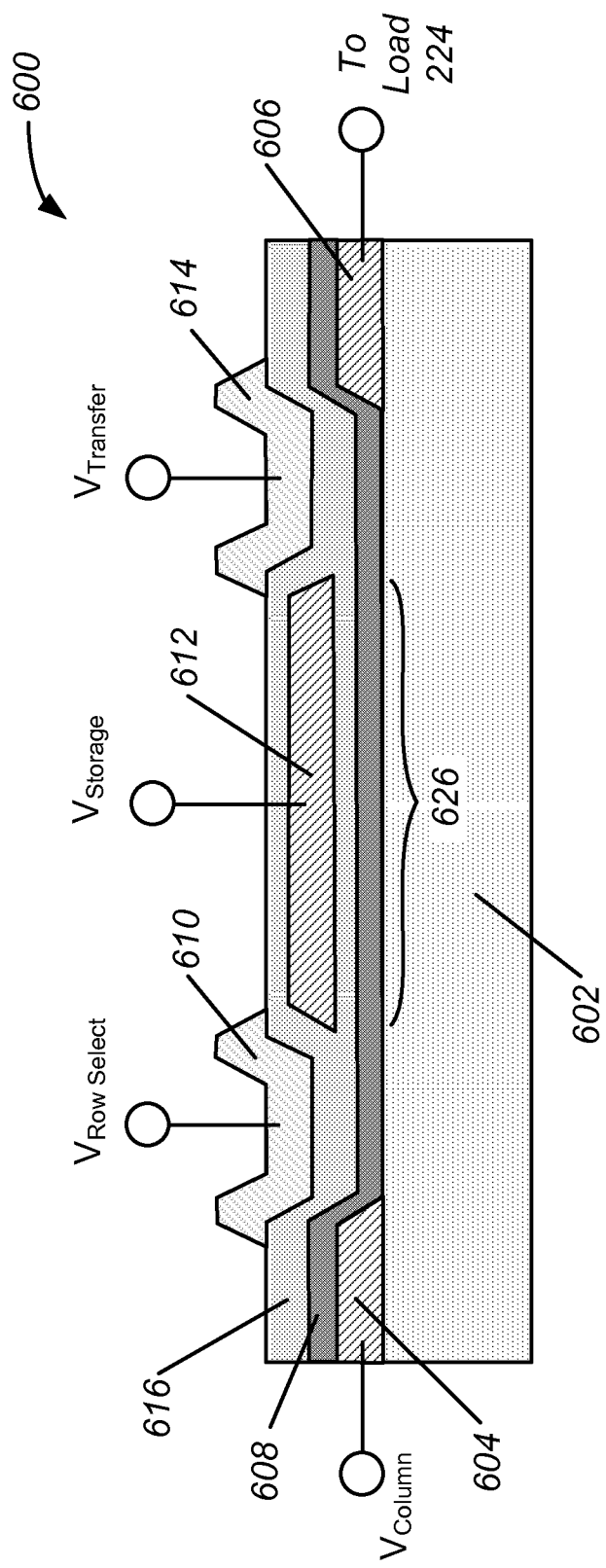
FIG. 6 shows a cross-sectional side view depiction of an example three-gate thin-film transistor.

In still other implementations, all three gate electrodes—the write gate electrode 210, the storage gate electrode 212 and the transfer gate electrode 214—can be arranged on the same side of the thin-film semiconducting layer 208, below or above the thin-film semiconducting layer 208. For example, such an implementation is depicted in FIG. 6, described later.

In the implementation depicted in FIG. 2, the write gate electrode 210 is insulated from the drain 204, the thin-film semiconducting layer 208 and other components by the upper dielectric layer 218. The upper dielectric layer 218 also insulates the transfer gate electrode 214 from the source 206, the thin-film semiconducting layer 208 and other components. The storage gate electrode 212 is insulated from the thin-film semiconducting layer 208 and other components by the lower dielectric layer 216.

In some implementations, the drain 204 is electrically coupled to receive a column voltage signal $V_{Column}$. In a typical matrix addressing scheme, a control signal is sent to each column of the display in the form of a column voltage signal and to each row of the display in the form of a row select voltage signal. Thus, for an m×n display, such a scheme can require m column voltage signals and n row select voltage signals. Each column voltage signal $V_{Column}$ can be applied to an entire column of display elements at one time. Similarly, each row select voltage signal $V_{RowSelect}$ can be applied to an entire row of display elements at one time. In the implementation depicted in FIG. 2, the write gate electrode 210 is electrically coupled to receive a row select voltage signal $V_{RowSelect}$. Additionally, the storage gate electrode 212 is electrically coupled to receive a storage control voltage signal $V_{Storage}$, the transfer gate electrode 214 is electrically coupled to receive a transfer control voltage signal $V_{Transfer}$, and the source 206 is electrically coupled to a load, such as a pixel or pixel element 224. For example, as described above, the pixel element 224 can be an LCD pixel or an IMOD pixel. However, in other implementations, the load to which the source 206 is coupled can be a different MEMS-based element or other electrical or electromechanical element. The source 206 also can be electrically coupled to receive a reset voltage signal $V_{Reset}$.

In some implementations, in a first mode of operation, the write gate electrode 210, the storage gate electrode 212 and the transfer gate electrode 214 are configured such that electrical charge is transferred in from the drain 204 and subsequently accumulated in an electrical potential well in a region 226 of the semiconducting layer 208 adjacent the storage gate electrode 212. In some implementations, in a second mode of operation, the write gate electrode 210, the storage gate electrode 212 and the transfer gate electrode 214 are configured such that the electrical charge previously accumulated in the region 226 of the semiconducting layer 208 adjacent the storage gate electrode 212 is transferred through the semiconducting layer 208 through a region of the semiconducting layer 208 adjacent the transfer gate electrode 214 and subsequently transferred through to the source 206. From the source 206, the transferred charge is output to the pixel element 224.

Figure 3:
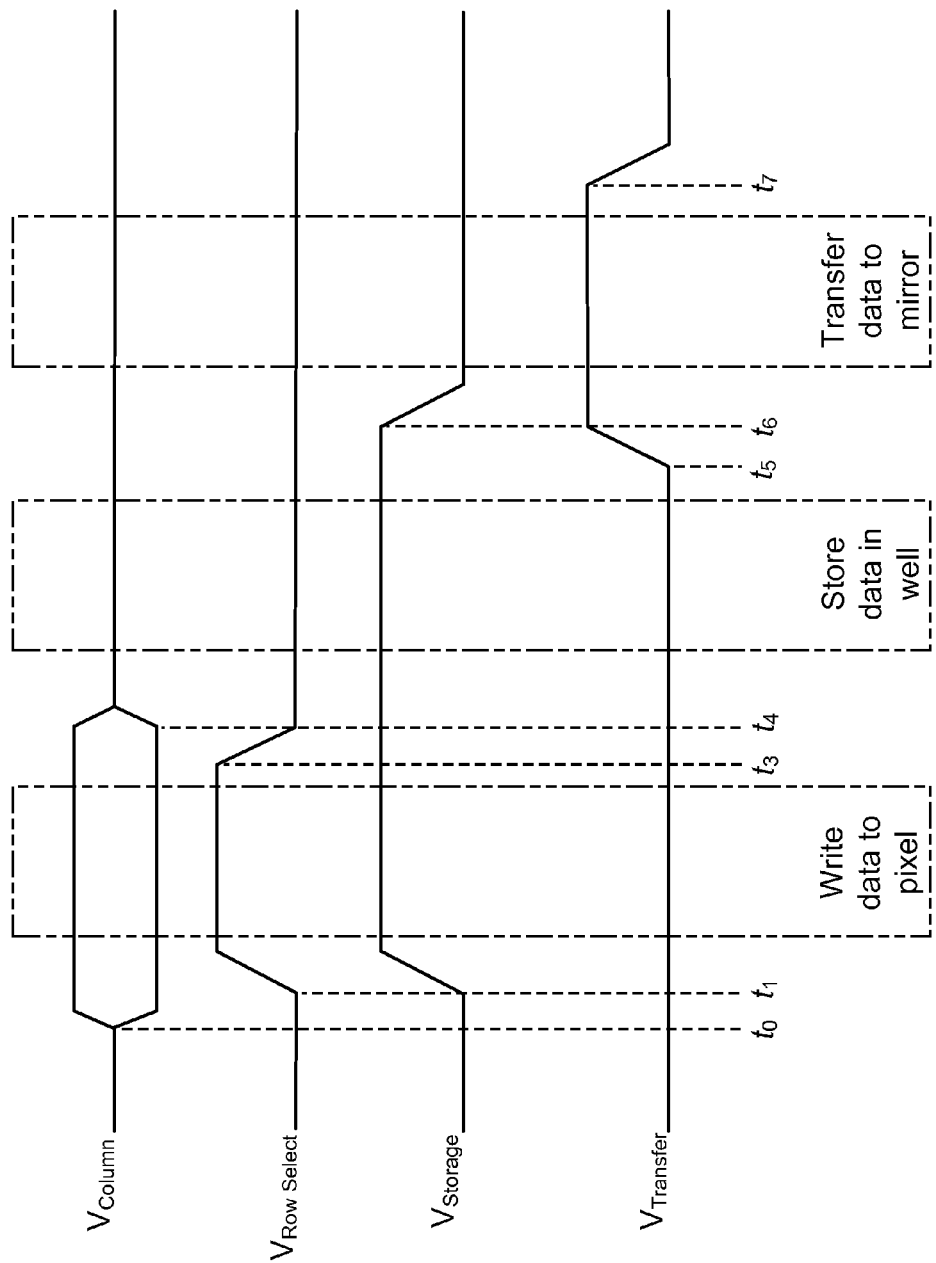
FIG. 3 shows a timing diagram depicting an example method of operating the three-gate thin-film transistor depicted in FIG. 2.

FIG. 3 shows a timing diagram depicting an example method of operating the three-gate TFT 200 depicted in FIG. 2. In the example timing diagram, the semiconducting layer 208 is an n-type semiconducting material, although the voltages can be reversed in other implementations when a p-type semiconducting material layer is used. In some implementations, at $t_0$, the data to be written to the display element 224 is applied via the column voltage signal $V_{Column}$ to the drain 204. At time $t_1$, the row select voltage signal $V_{RowSelect}$ is switched from low (e.g., a negative or small positive voltage) to high (e.g., a larger positive voltage than low) effectively "turning on" or "opening" the write gate electrode 210 to enable conduction through the semiconducting layer 208 below the write gate electrode 210. Also at time $t_1$, or thereabouts, the storage control voltage signal $V_{Storage}$ is switched from low to high. The transfer control voltage signal $V_{Transfer}$ remains low during this time, causing the transfer gate electrode 214 to be in a "turned-off" or "closed" state.

As a result of these biases to the drain 204, the write gate electrode 210 and the storage gate electrode 212, the majority charge carriers (e.g., electrons) received by the drain 204 flow through the semiconducting layer 208 toward the write gate electrode 210. Some of this charge may accumulate below the write gate electrode 210. As a result of the bias $V_{Storage}$ applied to the storage gate electrode 212, most of the charge flows into the region 226 adjacent the storage gate electrode 212. At time $t_3$, the row select voltage signal $V_{RowSelect}$ is switched from high to low. As a result, the remaining charge below the write gate electrode 210 flows into the region 226 adjacent the storage gate electrode 212. The column voltage $V_{Column}$ is switched off at $t_4$. The charge now accumulated in the region 226 is essentially trapped in an electrical potential well in the region 226 of the semiconducting layer 208 adjacent the storage gate electrode 212. Effectively, the storage gate electrode 210 and the region 226 of the semiconducting layer 208 serve as plates of a capacitor separated by the lower dielectric layer 216. In this way, the data to be written to the display element 224 can be efficiently stored as charge in the region 226.

In some implementations, after all the data is written to all the corresponding three-gate TFTs 200 of an entire display or sub-array of the display, the stored charge for the entire display (or sub-array) is synchronously transferred from the three-gate TFTs 200 to the corresponding coupled pixel elements 224. For example, starting at time $t_5$, the transfer control voltage signal $V_{Transfer}$ is switched from low to high effectively turning on the transfer gate electrode 214. At time $t_6$, the storage control voltage signal $V_{Storage}$ is switched from high to low effectively turning off the storage gate electrode 212. As a result, the charge previously accumulated in region 226 flows through the semiconducting layer 208 below the transfer gate electrode 214 and out through the source 206 where it is then transferred to the pixel element 224. After the charge is given time to transfer to the pixel element 224, the transfer control voltage signal $V_{Transfer}$ is then switched from high back to low at $t_7$ turning off the transfer gate electrode 214. In some implementations, a reset voltage $V_{Reset}$ is biased to reset the pixel element 224 prior to time $t_0$ or prior to $t_5$, or at another suitable time. For example, the reset voltage $V_{Reset}$ can be used to activate or close a switch 228 (such as a MOSFET transistor) that connects the pixel element 224 to ground.

Thus, when a given gate electrode is "turned on" or "open", the portion of the semiconducting layer 208 adjacent the given gate electrode is conducting for the majority charge carriers (electrons in an n-type semiconducting material) in an accumulation-type mode of operation. In contrast, when a given gate electrode is "turned off" or "closed," the portion of the semiconducting layer 208 adjacent the given gate electrode is effectively non-conducting because it serves as an energy barrier.

In some implementations, the drain 204, the write gate electrode 210, the storage gate electrode 212, the transfer gate electrode 214 and the source 206 are arranged such that there is some "vertical" overlap of the drain 204 and the write gate electrode 210, some vertical overlap of the write gate electrode 210 and the storage gate electrode 212, some vertical overlap of the storage gate electrode 212 and the transfer gate electrode 214, and some vertical overlap of the transfer gate electrode 214 and the source 206. This overlap ensures high capacitive coupling and efficient transfer of charge across the semiconducting layer 208 from potential well to potential well as the biases applied to the gate electrodes are switched; that is, from the portion of the semiconducting layer 208 below a given one of the gate electrodes to the next gate electrode as the biases are switched.

The storage gate electrode 212 effectively functions as an "active MOS capacitor." In the first mode of operation the biasing conditions are such that the storage gate electrode 212 is configured to a high-capacitance state to facilitate the transfer and accumulation of charge in the region 226 of the semiconducting layer 208 adjacent the storage gate electrode 212. Conversely, in the second mode of operation the biasing conditions are such that the storage gate electrode 212 is configured to a low-capacitance state to facilitate the transfer of charge from the region 226 through the source 206 to the pixel element 224. While in the high capacitance state, a relatively low column voltage signal $V_{Column}$ can inject a large amount of current into the region 226 adjacent the storage gate electrode 212. While in the low capacitance state, when the region 226 is electrically-coupled via transfer gate electrode 214 to the pixel element 224, the three-gate TFT 200 achieves a highly efficient charge transfer to the pixel element 224.

In particular implementations, the capacitance-switching capability of the three-gate TFT 200 plays a primary role, or is key factor, in lowering the required column voltage $V_{Column}$. The capacitance-switching capability also ensures that most, if not substantially all, of the charge that is stored by the storage gate electrode 212 in the region 226 of the semiconducting layer 208 can be transferred to the target load, whether a pixel element 224, another MEMS element or other electrical element or device. More particularly, by reducing, during or prior to the transfer operation, the capacitance of the storage gate electrode 212 and the region 226, virtually all of the charge stored in the region 226 can be rapidly transferred to the load element 224. This is in contrast to traditional bucket brigade capacitor arrays, in which the transfer of charge often depends on the capacitance values that are presented at each node; this can be a problem for display devices that present a variable capacitance, depending on what state the display element happens to be in.

This also is a significant distinction from conventional displays that use passive capacitors having associated fixed capacitances to store and transfer charge during the write operation. In such conventional devices, the degree of charge transfer depends on the magnitudes of the capacitance of the storage capacitor and the capacitance of the pixel element 224. That is, in conventional displays using passive capacitors, because the capacitance is fixed the charge stored in the passive capacitor during the write operation will be shared between the passive capacitor and the load it is driving during the transfer operation. This is disadvantageous at least in part because the power consumed by, for example, an active matrix display, is proportional to the square of the column voltage multiplied by the relatively large parasitic capacitances. In some implementations, the total parasitic capacitance is the sum of transistor parasitic capacitances (also referred to as the gate to source capacitances), fringing capacitances local to the pixel, and interconnect trace to ground capacitances, such as from overlap and the fringing capacitances when integrated along the entire column drive electrode. By way of reference, for some modern display panels with relatively high resolution (e.g., 500-1000 rows), the total parasitic capacitance can be in the range of 10-100 pF or even higher.

The ability of the three-gate TFT 200 to switch from a high-capacitance state to write and store charge, to a low-capacitance state to transfer charge to the pixel element 224, can result in significant savings in power, among other advantages. The capacitance switching feature also allows for accurate charge injection to the pixel element 224 even though the capacitance state of the pixel element 224 can vary. More specifically, the disclosed capacitance switching feature can allow for accurate charge injection by designing the three-gate TFT 200 such that the capacitance of the storage gate electrode 212 while in the low capacitance state is lower than the minimum capacitance value of the pixel element 224 by a sufficient margin. This also can have important stability implications on the control of the pixel element 224 because the charge control aspect allows for improved tuning range.

In some implementations, one or more of the gate electrodes 210, 212 and 214 can each be formed from one or metals, alloys of metals, or layers of metals, alloys or other materials. For example, metals that are suitable for forming the gate electrodes 210, 212 and 214 can include Al, Mo, Ti, W or Cu. In some implementations, the semiconducting layer 208 is formed of Indium Gallium Zinc Oxide (IGZO). But in some other implementations, the semiconducting layer 208 can generally be formed of any suitable oxide semiconductor, such as an amorphous oxide semiconductor. For example, suitable materials that can be used in forming an amorphous oxide semiconductor layer can include In, Zn, Sn, Hf and Ga. Some specific examples include InGaZnO, InZnO, InHfZnO, InSnZnO, SnZnO, InSnO, GaZnO and ZnO. In some implementations, such oxide semiconductor layers can be formed with physical vapor deposition (PVD) techniques including, for example, one or more of pulsed laser deposition (PLD), sputter deposition, electron beam PVD (e-beam PVD) and evaporative deposition. In some implementations, the semiconductor layer 208 has a thickness in the range of approximately 20 to 100 nm.

In particular implementations, the three-gate TFT 200 exhibits extremely low leakage and, when on, operates solely in accumulation mode (as opposed to an inversion mode). The MOS capacitor formed by the storage gate electrode 212 essentially varies from the sum of the oxide capacitance, the overlap capacitance between the storage gate electrode 212 and the write gate electrode 210, and the overlap capacitance between the storage gate electrode 212 and the transfer gate electrode 214 (high) when the MOS capacitor is in accumulation mode, to only the sum of the overlap capacitance between the storage gate electrode 212 and the write gate electrode 210 and the overlap capacitance between the storage gate electrode 212 and the transfer gate electrode 214 (small) when the MOS capacitor is turned off. In some implementations, the three-gate TFT 200 is characterized by a flat band gate voltage when the band bending due to the MOS junction physics is offset by the voltage applied to the storage gate electrode 212. This offset also serves as the boundary between accumulation mode—when the majority carriers migrate toward the semiconductor-dielectric interface—and the beginning of a weak depletion regime. For example, when IGZO is used to form an n-type semiconducting material layer 208, the accumulation becomes stronger as the voltage $V_{Storage}$ is increased positively above the flatband voltage, while the depletion takes effect when the voltage is driven negatively below the flatband voltage.

Figure 4:
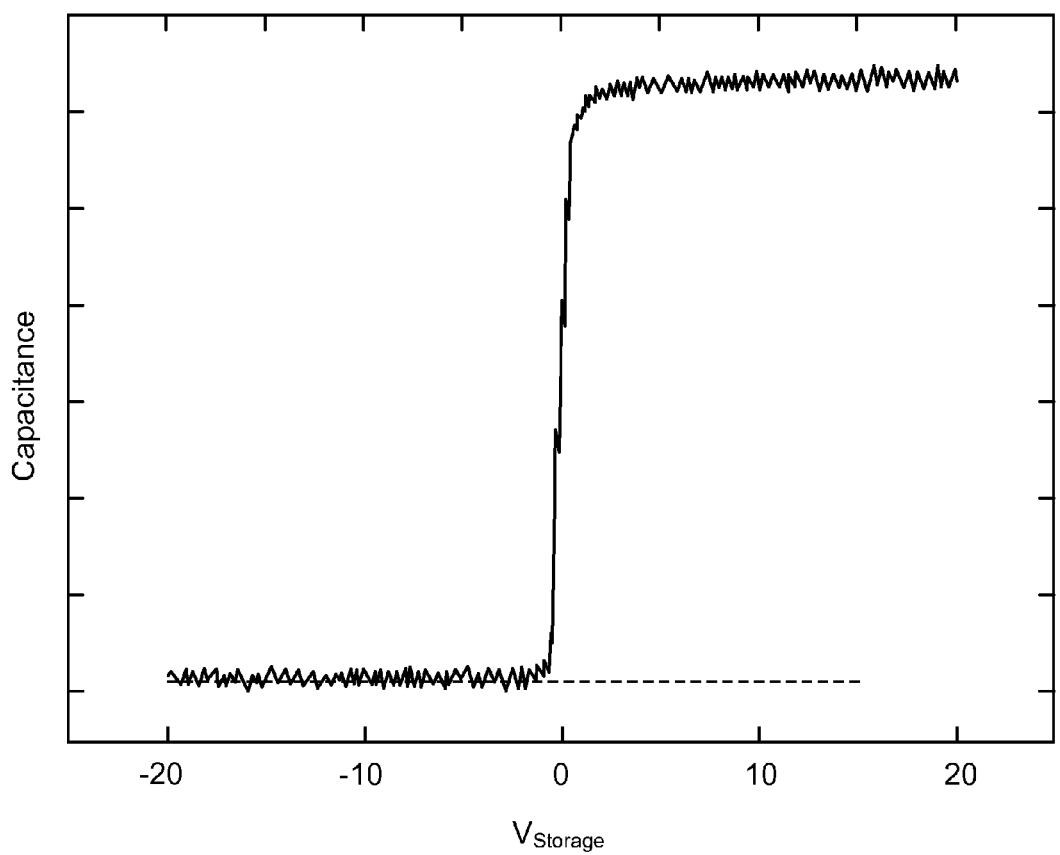
FIG. 4 shows a plot of the capacitance between the storage region and the storage gate electrode of FIG. 2 as a function of the gate voltage applied to the storage gate electrode.

FIG. 4 shows a plot of the capacitance of the MOS capacitor formed by the storage region 226 and the storage gate electrode 212 as a function of the gate voltage $V_{Storage}$ applied to the storage gate electrode 212. In some implementations, the capacitance-voltage (CV) profile or characteristic shown in FIG. 4 is described or approximated by the equation:

$$\frac{C_{Storage}(\text{High})}{C_{Storage}(\text{Low})} = \frac{C_{oxide} + C_{GS} + C_{GD}}{C_{GS} + C_{GD}}$$

where $C_{oxide}$ is the gate-insulator capacitance and $C_{Storage}$(High) is the high state capacitance and $C_{Storage}$(Low) is the low state capacitance of the storage gate electrode 212 and $C_{GS}$ and $C_{GD}$ are the gate to source and gate to drain overlap capacitances respectively.

In some implementations, such as that depicted in FIG. 2 and FIG. 5, this vertical overlap of the gate electrodes 210, 212 and 214 is accomplished by fabricating the first and third gates on an opposite side of the semiconducting channel as the storage gate. This topology is not available for crystalline Si MOSFET transistors because the conducting channel in such transistors is produced by an inversion layer and the gate can be formed only on one side of the channel, the channel being an integral top portion of the bulk Si substrate.

However, as described above, in some other implementations, all three gate electrodes—the write gate electrode, the storage gate electrode and the transfer gate electrode—can be arranged on the same side of a thin-film semiconducting layer 208 in a TFT topology, below or above the thin-film semiconducting layer 208 in which the confinement region 626 can be formed. FIG. 6 shows a cross-sectional side view depiction of an example three-gate TFT 600. Unlike in the three-gate TFT 200 and the three-gate TFT 500 depicted in FIGS. 2 and 5, respectively, in the three-gate TFT 600 depicted in FIG. 6, all three gate electrodes—the write gate electrode 610, the storage gate electrode 612 and the transfer gate electrode 614 are arranged above the thin-film semiconducting layer 608. As with the three-gate TFT 200 and the three-gate TFT 500, in some implementations, the drain 604, the write gate electrode 610, the storage gate electrode 612, the transfer gate electrode 614 and the source 606 are arranged such that there is some vertical overlap of the drain 604 and the write gate electrode 610, some vertical overlap of the write gate electrode 610 and the storage gate electrode 612, some vertical overlap of the storage gate electrode 612 and the transfer gate electrode 614, and some vertical overlap of the transfer gate electrode 614 and the source 606. This overlap ensures high capacitive coupling and efficient transfer of charge across the semiconducting layer 608 from potential well to potential well as the biases applied to the gate electrodes are switched. A dielectric layer 616 insulates the gate electrodes from one another and from other components of the three-gate TFT 600. The three-gate TFT 600 also can be constructed on a substrate 602.

As with the three-gate TFT 200, in the first mode of operation of three-gate TFT 600, the biasing conditions are such that the storage gate electrode 612 is configured to a high-capacitance state to facilitate the transfer and accumulation of charge in the region 626 of the semiconducting layer 608 adjacent the storage gate electrode 612. Conversely, in the second mode of operation the biasing conditions are such that the storage gate electrode 612 is configured to a low-capacitance state to facilitate the transfer of charge from the region 626 through the source 606 to the pixel element 224 or other load.

Figure 7:
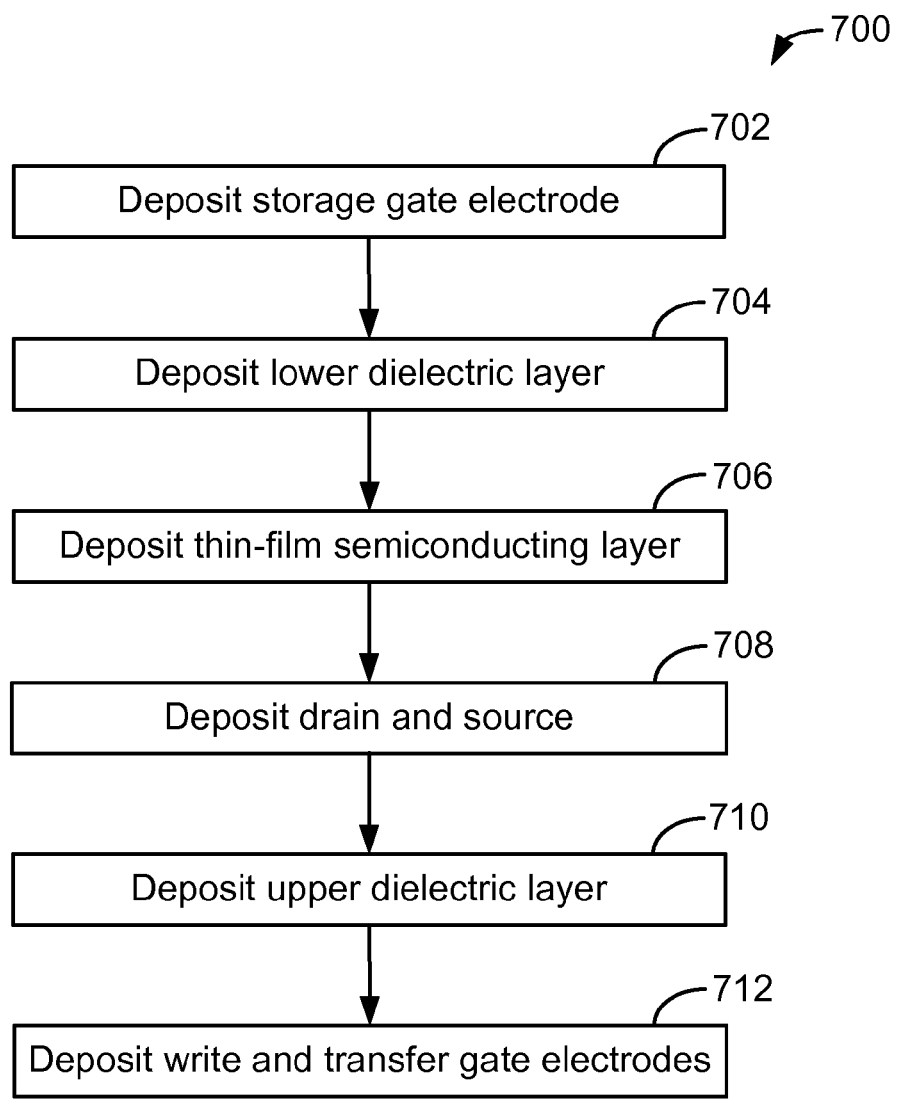
FIG. 7 shows a flow diagram depicting an example method that can be used to form the three-gate thin-film transistor depicted in FIG. 2.

FIG. 7 shows a flow diagram depicting an example method 700 that can be used to form the three-gate TFT 200 depicted in FIG. 2. A similar method can be used to form the three-gate TFT 500 depicted in FIG. 5 and the three-gate TFT 600 depicted in FIG. 6. In some implementations, the method 700 begins with a substrate 202. For example, substrate 202 can be a glass substrate or wafer or another dielectric substrate. In block 702, the storage gate electrode 212 is deposited by, for example, physical vapor deposition processes (e.g., sputtering, co-sputtering, reactive sputtering or thermal evaporation) or any of the other processes described above and using any of the materials described above for forming the storage gate electrodes 210, 212 and 214. In some implementations, the storage gate electrode 212 is substantially or significantly wider or even longer than the write and transfer gate electrodes 210 and 214. In block 704, the first lower dielectric layer 216 is deposited, grown, or otherwise arranged over the storage gate electrode 212 and other portions of the substrate 202. For example, the dielectric layers 216 and 218 can be formed of an oxide such as SiO, $SiO_2$ or $Al_2O_3$, among other materials, and can have a thickness of approximately 200 nm (although thinner or thicker thicknesses may be appropriate or suitable in some applications).

Next, in block 706, the thin-film semiconducting layer 208 is deposited. For example, in some implementations the semiconducting layer 208 has a thickness in the range of approximately 10 nanometers (nm) to approximately 100 nm and can be formed of any of the materials described above for forming the semiconducting layer 208, including IGZO. In block 708, the drain 204 and the source 206 can be deposited. In some implementations, the drain 204 and the source 206 can be formed of a metal such as, for example, Molybdenum. In some implementations, the second upper dielectric layer 218 is then deposited in block 710. Finally, the write and transfer gate electrodes 210 and 214 can be deposited in block 712. Additionally, in some implementations, one or more of the drain 204, the source 206 and the gate electrodes 210, 212 and 214 can be electrically coupled via traces or other conductive means (parts of which may be buried below the dielectric layers or other elements) to device contacts (not shown) that can be formed of a metal or metallic alloy (e.g., molybdenum (Mo)) and used to electrically couple the respective element to the corresponding one of the electrical signals described above.

As described above, in IMOD display panels and other voltage/charge driven pixel displays, such as liquid crystal displays (LCDs), it is often desirable to update the display elements for an entire frame synchronously. While the implementations disclosed herein can be particularly well-suited or advantageous in such synchronous schemes, these or similar implementations also are well-suited for other frame update schemes such as traditional row by row update schemes.

The description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Figure 8A:
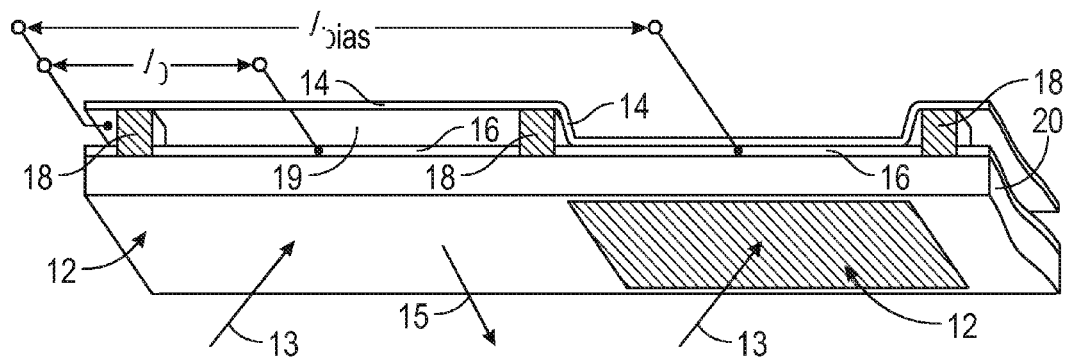
FIG. 8A is an isometric view illustration depicting two adjacent interferometric modulator (IMOD) display elements in a series or array of display elements of an IMOD display device.

FIG. 8A is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 8A includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 8A, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 8A and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 μm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 8A, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 8A. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa.

Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 8B:
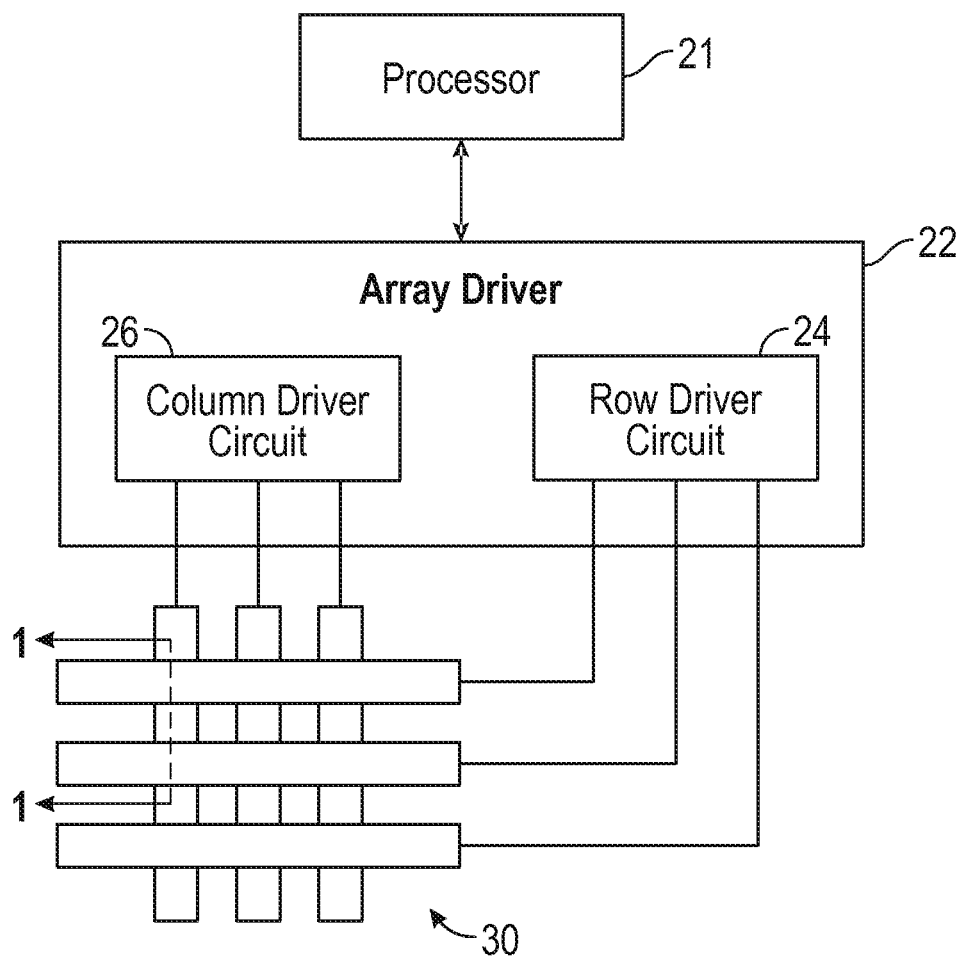
FIG. 8B is a system block diagram illustrating an electronic device incorporating an IMOD-based display including a three element by three element array of IMOD display elements.

FIG. 8B is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 8A is shown by the lines 1-1 in FIG. 8B. Although FIG. 8B illustrates a 3×3 array of IMOD display elements for the sake of clarity, the display array 30 may contain a very large number of IMOD display elements, and may have a different number of IMOD display elements in rows than in columns, and vice versa.

Figure 9A:
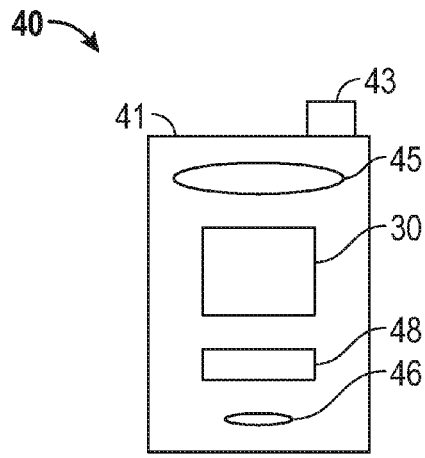
FIGS. 9A and 9B are system block diagrams illustrating a display device that includes a plurality of IMOD display elements.
Figure 9B:
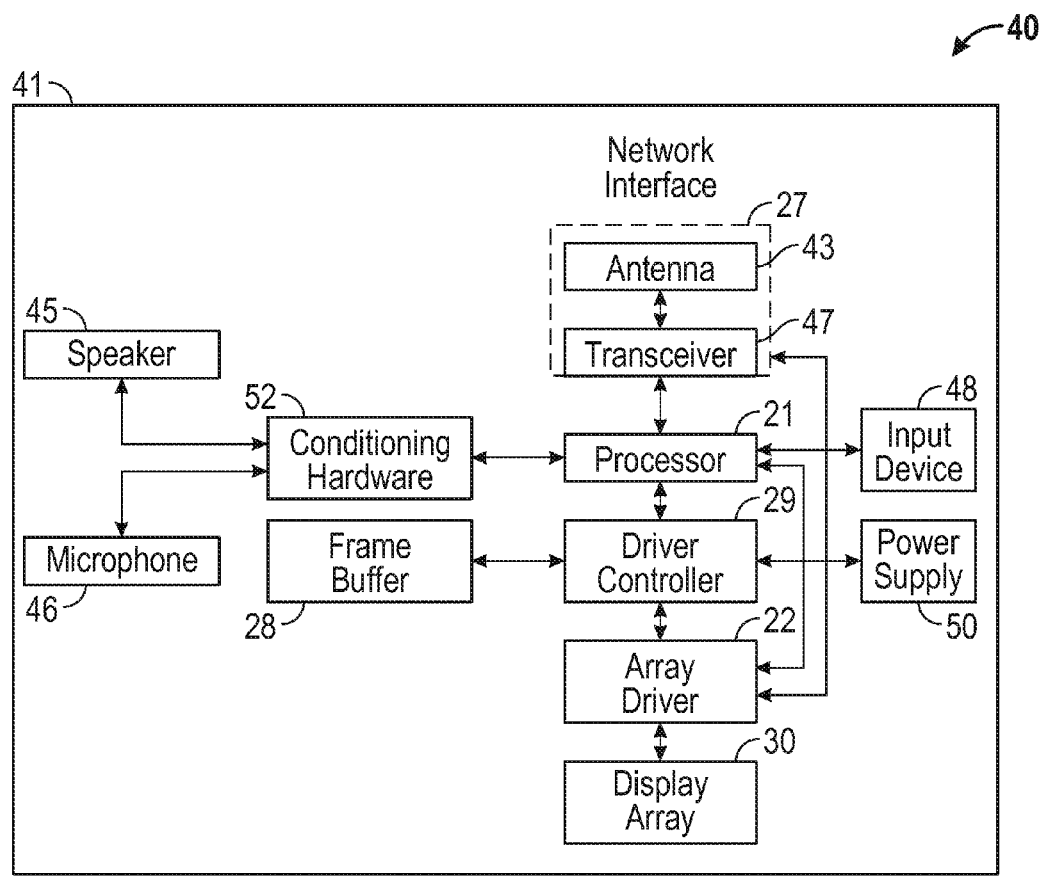

FIGS. 9A and 9B are system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 9A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 9A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.8A, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A device comprising:
   a substrate;
   a thin-film semiconducting layer over the substrate;
   a drain coupled to the semiconducting layer and capable of receiving an input signal;
   a source coupled to the semiconducting layer and capable of providing an output signal;
   a first gate electrode adjacent a first portion of the semiconducting layer between the drain and the source, the first gate electrode capable of receiving a first control signal, the first gate electrode capable of controlling a flow of charge carriers through the first portion responsive to the first control signal;
   a second gate electrode adjacent a second portion of the semiconducting layer between the drain and the source, the second gate electrode capable of receiving a second control signal, the second gate electrode capable of controlling a flow of charge carriers through the second portion responsive to the second control signal;
   a third gate electrode adjacent a third portion of the semiconducting layer between the drain and the source, the third gate electrode capable of receiving a third control signal, the third gate electrode capable of controlling a flow of charge carriers through the third portion responsive to the third control signal;
   the second gate electrode being between the first and the third gate electrodes along the semiconducting layer, there being a partial overlap of the first and the second gate electrodes and a partial overlap of the second and the third gate electrodes; and
   one or more dielectric layers that insulate the first gate electrode from the semiconducting layer, that insulate the second gate electrode from the semiconducting layer, that insulate the third gate electrode from the semiconducting layer, and that insulate the first, the second, and the third gate electrodes from one another;
   wherein the first, the second and the third gate electrodes are capable of storing charge carriers within the second portion of the semiconducting layer while the first portion of the semiconducting layer is non-conducting responsive to the first control signal, the second portion of the semiconducting layer is conducting responsive to the second control signal and the third portion of the semiconducting layer is non-conducting responsive to the third control signal.

2. The device of claim 1, wherein, in a first mode of operation:
   the third portion of the semiconducting layer is non-conducting responsive to the third control signal;
   the first portion of the semiconducting layer is conducting responsive to the first control signal;
   the second portion of the semiconducting layer is conducting responsive to the second control signal;
   the drain receives the input signal and transfers charge into the first portion of the semiconducting layer while the first portion is conducting, while the second portion is conducting and while the third portion is non-conducting;
   after charge is transferred into the first portion, the first portion of the semiconducting layer is made non-conducting responsive to the first control signal; and
   while the first portion is non-conducting, the charge transferred into the first portion is stored in the second portion responsive to the second control signal.

3. The device of claim 1, wherein, in a second mode of operation:
   the third portion of the semiconducting layer is conducting responsive to the third control signal;
   while the third portion is conducting, the second portion of the semiconducting layer is made non-conducting responsive to the second control signal; and
   while the third portion is conducting and the second portion is non-conducting, charge stored in the second portion is transferred through the third portion to the source, which outputs the output signal based on the transferred charge.

4. The device of claim 1, wherein, in a first mode of operation, the second gate electrode is in a high capacitance state in response to the second control signal to facilitate an accumulation of charge in the second portion of the semiconducting layer.

5. The device of claim 1, wherein, in a second mode of operation, the second gate electrode is in a low capacitance state to facilitate the transfer of charge from the second portion of the semiconducting layer through the third portion of the semiconducting layer and into the source.

6. The device of claim 1, wherein:
   the first gate electrode is adjacent a first side of the semiconducting layer;
   the second gate electrode is adjacent a second side of the semiconducting layer opposite the first side; and
   the third gate electrode is adjacent the first side.

7. The device of claim 6, wherein the second side of the semiconducting layer is adjacent the substrate such that the second gate electrode is between the thin-film semiconducting layer and the substrate.

8. The device of claim 1, wherein:
   the first gate electrode is adjacent a first side of the semiconducting layer;
   the second gate electrode is adjacent the first side; and
   the third gate electrode is adjacent the first side.

9. The device of claim 1, wherein the semiconducting layer has a thickness in the range of approximately 10 nanometers (nm) to approximately 100 nm.

10. The device of claim 1, wherein the thickness of all of the one or more dielectric layers between each of the first, the second, and the third gate electrodes and the respective portions of the semiconducting layer adjacent the first, the second, and the third gate electrodes is less than about 200 nm.

11. The device of claim 1, wherein the semiconducting layer includes at least one of amorphous Indium Gallium Zinc Oxide (IGZO), amorphous silicon (Si), or low-temperature polycrystalline silicon (LTPS).

12. The device of claim 1, wherein the output signal drives a microelectromechanical systems (MEMS)-based device or a liquid crystal display (LCD) pixel element.

13. The device of claim 1, wherein the charge carriers are majority charge carriers relative to the semiconducting layer.

14. A device comprising:
a substrate;
a thin-film semiconducting layer over the substrate;
a drain coupled to the semiconducting layer and capable of receiving an input signal;
a source coupled to the semiconducting layer and capable of providing an output signal;
a first gate electrode adjacent a first portion of the semiconducting layer between the drain and the source, the first gate electrode capable of receiving a first control signal, the first gate electrode capable of controlling a flow of charge carriers through the first portion responsive to the first control signal;
a second gate electrode adjacent a second portion of the semiconducting layer between the drain and the source, the second gate electrode capable of receiving a second control signal, the second gate electrode capable of controlling a flow of charge carriers through the second portion responsive to the second control signal;
a third gate electrode adjacent a third portion of the semiconducting layer between the drain and the source, the third gate electrode capable of receiving a third control signal, the third gate electrode capable of controlling a flow of charge carriers through the third portion responsive to the third control signal;
the second gate electrode being between the first and the third gate electrodes along the semiconducting layer, there being a partial overlap of the first and the second gate electrodes and a partial overlap of the second and the third gate electrodes;
one or more dielectric layers that insulate the first gate electrode from the semiconducting layer, that insulate the second gate electrode from the semiconducting layer, that insulate the third gate electrode from the semiconducting layer, and that insulate the first, the second, and the third gate electrodes from one another; and
the device being capable of operating, responsive to the first, the second and the third control signals, in at least a first mode of operation in which:
the first portion of the semiconducting layer is conducting responsive to the first control signal;
the second portion of the semiconducting layer is conducting responsive to the second control signal;
the third portion of the semiconducting layer is non-conducting responsive to the third control signal;
the drain receives the input signal and transfers charge into the first portion of the semiconducting layer while the first portion is conducting, while the second portion is conducting and while the third portion is non-conducting;
after charge is transferred into the first portion, the first portion of the semiconducting layer is made non-conducting responsive to the first control signal; and
while the first portion is non-conducting, the charge transferred into the first portion is stored in the second portion responsive to the second control signal.

15. The device of claim 14, wherein, in the first mode of operation, the second gate electrode is in a high capacitance state in response to the second control signal to facilitate an accumulation of charge in the second portion of the semiconducting layer.

16. The device of claim 14, wherein the device is further capable of operating, responsive to the first, the second and the third control signals, in a second mode of operation in which:
the third portion of the semiconducting layer is conducting responsive to the third control signal;
while the third portion is conducting, the second portion of the semiconducting layer is made non-conducting responsive to the second control signal; and
while the third portion is conducting and the second portion is non-conducting, charge stored in the second portion is transferred through the third portion to the source, which outputs the output signal based on the transferred charge.

17. The device of claim 16, wherein, in the second mode of operation, the second gate electrode is in a low capacitance state to facilitate the transfer of charge from the second portion of the semiconducting layer through the third portion of the semiconducting layer and into the source.

18. A system comprising:
a display driver capable of providing a plurality of independently controllable signals including an input signal, a first control signal, a second control signal and a third control signal, the display driver being capable of providing each of the independently controllable signals with a value independent of the other independently controllable signals;
a display including an array of pixel elements; and
an array of multi-gate thin-film transistors each respectively coupled with a corresponding pixel element and including:
a thin-film semiconducting layer;
a drain coupled to the semiconducting layer and capable of receiving the input signal;
a source coupled to the semiconducting layer and capable of providing an output signal;
a first gate electrode adjacent a first portion of the semiconducting layer between the drain and the source, the first gate electrode capable of controlling a flow of charge carriers through the first portion responsive to the first control signal;
a second gate electrode adjacent a second portion of the semiconducting layer between the drain and the source, the second gate electrode capable of controlling a flow of charge carriers through the second portion responsive to the second control signal;
a third gate electrode adjacent a third portion of the semiconducting layer between the drain and the source, the third gate electrode capable of controlling a flow of charge carriers through the third portion responsive to the third control signal;
the second gate electrode being between the first and the third gate electrodes along the semiconducting layer, there being a partial overlap of the first and the second gate electrodes and a partial overlap of the second and the third gate electrodes; and one or more dielectric layers that insulate the first gate electrode from the semiconducting layer, that insulate the second gate electrode from the semiconducting layer, that insulate the third gate electrode from the semiconducting layer, and that insulate the first, the second, and the third gate electrodes from one another.

19. The system of claim 18, wherein the first, the second and the third gate electrodes are capable of storing charge carriers within the second portion of the semiconducting layer responsive to the first, the second and the third control signals.

20. The device of claim 18, wherein the semiconducting layer has a thickness in the range of approximately 10 nanometers (nm) to approximately 100 nm.

21. The device of claim 18, wherein the thickness of all of the one or more dielectric layers between each of the first, the second, and the third gate electrodes and the respective portions of the semiconducting layer adjacent the first, the second, and the third gate electrodes is less than about 200 nm.

22. The device of claim 18, wherein the semiconducting layer includes at least one of amorphous Indium Gallium Zinc Oxide (IGZO), amorphous silicon (Si), or low-temperature polycrystalline silicon (LTPS).

* * * * *